(12) United States Patent
Yan et al.

(10) Patent No.: US 12,477,893 B2
(45) Date of Patent: Nov. 18, 2025

(54) LIGHT EMITTING TRANSISTOR, MANUFACTURING METHOD THEREOF AND DISPLAY SUBSTRATE

(71) Applicant: BOE TECHNOLOGY GROUP CO., LTD., Beijing (CN)

(72) Inventors: Huajie Yan, Beijing (CN); Zhiqiang Jiao, Beijing (CN); Lu Wang, Beijing (CN); Peng Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/921,281

(22) PCT Filed: Dec. 14, 2021

(86) PCT No.: PCT/CN2021/137896
§ 371 (c)(1),
(2) Date: Oct. 25, 2022

(87) PCT Pub. No.: WO2023/108415
PCT Pub. Date: Jun. 22, 2023

(65) Prior Publication Data
US 2024/0224576 A1      Jul. 4, 2024

(51) Int. Cl.
*H10K 50/30* (2023.01)
*H10K 50/805* (2023.01)
*H10K 71/60* (2023.01)
*H10K 59/80* (2023.01)

(52) U.S. Cl.
CPC ........... *H10K 50/30* (2023.02); *H10K 50/805* (2023.02); *H10K 71/60* (2023.02); *H10K 59/80* (2023.02)

(58) Field of Classification Search
None
See application file for complete search history.

(56) References Cited

U.S. PATENT DOCUMENTS

| | | |
|---|---|---|
| 2010/0096621 A1 | 4/2010 | Chuman |
| 2013/0240842 A1 | 9/2013 | Rinzler et al. |
| 2014/0124759 A1 | 5/2014 | Mok et al. |

(Continued)

FOREIGN PATENT DOCUMENTS

| | | |
|---|---|---|
| CN | 100466313 C | 3/2009 |
| CN | 103460424 A | 12/2013 |
| CN | 103811673 A | 5/2014 |

(Continued)

*Primary Examiner* — Anthony Ho
(74) *Attorney, Agent, or Firm* — HOUTTEMAN LAW LLC

(57) ABSTRACT

A light emitting transistor, a method of manufacturing the same, and a display substrate are provided. The light emitting transistor includes: a gate electrode on a base substrate; an insulating layer on a side of the gate electrode away from the base substrate; a first electrode on a side of the insulating layer away from the base substrate, wherein the first electrode is provided with a plurality of through holes therein, which are divided into a plurality of through hole groups arranged side by side in a first direction; each through hole group includes multiple through holes arranged in a second direction, the first direction intersects the second direction; a light emitting functional layer on a side of the first electrode away from the base substrate; and a second electrode on a side of the light emitting functional layer away from the base substrate.

19 Claims, 9 Drawing Sheets

(56) References Cited

U.S. PATENT DOCUMENTS

| | | |
|---|---|---|
| 2016/0155970 A1 | 6/2016 | Chung |
| 2018/0358568 A1 | 12/2018 | Luan et al. |

FOREIGN PATENT DOCUMENTS

| | | |
|---|---|---|
| CN | 106887449 A | 6/2017 |
| CN | 109686744 A | 4/2019 |
| CN | 111180597 A | 5/2020 |
| CN | 113571666 A | 10/2021 |

LIGHT EMITTING TRANSISTOR, MANUFACTURING METHOD THEREOF AND DISPLAY SUBSTRATE

TECHNICAL FIELD

The present disclosure relates to the field of display technology, and in particular to a light emitting transistor, a manufacturing method thereof and a display substrate.

BACKGROUND

Organic electronic devices, such as organic light emitting diodes and organic field effect transistors, have received great attention due to their advantages of light weight, flexibility, mass production at low cost, and the like. The organic light emitting diodes are mainly applied to a flat panel display, and the organic field effect transistors may be applied to an active driving unit of the flat panel display. The organic light emitting transistors integrating light emission and a current regulation function of a traditional transistor may provide a foundation for realizing a real all-organic high-integration electronic device.

SUMMARY

The present disclosure provides a light emitting transistor, a manufacturing method thereof and a display substrate.

The present disclosure provides a light emitting transistor including: a gate electrode on a base substrate; an insulating layer on a side of the gate electrode away from the base substrate: a first electrode on a side of the insulating layer away from the base substrate, wherein the first electrode is provided with a plurality of through holes therein, which are divided into a plurality of through hole groups arranged side by side in a first direction: each through hole group includes multiple of the plurality of through holes arranged in a second direction, the first direction intersects the second direction: a light emitting functional layer on a side of the first electrode away from the base substrate; and a second electrode on a side of the light emitting functional layer away from the base substrate.

In some embodiments, the light emitting transistor further includes: a topological insulating pattern layer on the insulating layer and including a plurality of topological insulating pattern portions spaced apart from each other, wherein the plurality of topological insulating pattern portions are in one-to-one correspondence with the plurality of through holes, the plurality of topological insulating pattern portions are made of a metal-organic topological insulator material, the first electrode is made of a metal material, and a metal element in the metal material is the same as that in the metal-organic topological insulator material.

In some embodiments, the metal-organic topological insulator material includes MgAg-DCA and the first electrode is made of a magnesium silver alloy.

In some embodiments, a plurality of insulating protrusions are arranged on a surface of the insulating layer away from the base substrate and spaced apart from each other, and are in one-to-one correspondence with the plurality of through holes; the light emitting transistor includes a first metal layer including the first electrode and a plurality of redundant electrodes: each redundant electrode is arranged on a surface of one corresponding insulating protrusion away from the base substrate, and is disconnected from the first electrode.

In some embodiments, a cross-sectional area of a surface of each insulating protrusion close to the base substrate is less than that of a surface of the insulating protrusion away from the base substrate.

In some embodiments, the first electrode has a mesh structure including a plurality of metal portions arranged side by side in the first direction: each adjacent two of the plurality of metal portions have mirror symmetry: each metal portion includes: a plurality of first bending portions and a plurality of second bending portions, which are alternately arranged in the second direction and bend in opposite directions: wherein the plurality of first bending portions and the plurality of second bending portions of each adjacent two of the plurality of metal portions define a plurality of meshes of the mesh structure.

In some embodiments, an orthographic projection of each through hole on the base substrate is polygonal or substantially circular.

In some embodiments, the first electrode has a thickness in a range from 1 nm to 1000 nm.

In some embodiments, the insulating layer includes at least: a first insulating sub-layer and a second insulating sub-layer, wherein the first insulating sub-layer is on a side of the second insulating sub-layer close to the base substrate: the first insulating sub-layer has a dielectric constant greater than that of the second insulating sub-layer, and has a breakdown field strength less than that of the second insulating sub-layer.

In some embodiments, the light emitting functional layer includes: an electron transport layer, a light emitting layer, and a hole transport layer, which are sequentially arranged in a direction away from the base substrate: or the light emitting functional layer includes a hole transport layer, a light emitting layer, and an electron transport layer, which are sequentially arranged in the direction away from the base substrate.

The embodiment of the present disclosure further provides a method for manufacturing a light emitting transistor, including: forming a gate electrode on a base substrate: forming an insulating layer on a side of the gate electrode away from the base substrate: forming a first electrode on a side of the insulating layer away from the base substrate, wherein the first electrode is provided with a plurality of through holes therein, which are divided into a plurality of through hole groups arranged side by side in a first direction: each through hole group includes multiple of the plurality of through holes arranged in a second direction, the first direction intersects the second direction: forming a light emitting functional layer on a side of the first electrode away from the base substrate: and forming a second electrode on a side of the light emitting functional layer away from the base substrate.

In some embodiments, forming a first electrode on a side of the insulating layer away from the base substrate includes: forming a topological insulating pattern layer on a side of the insulating layer away from the base substrate, wherein the topological insulating pattern layer includes a plurality of topological insulating pattern portions spaced apart from each other, the plurality of topological insulating pattern portions are made of a metal-organic topological insulator material, depositing a metal material on the insulating layer to form the first electrode provided with the plurality of through holes, wherein a metal element in the metal material is the same as that in the metal-organic topological insulator material, and the plurality of through holes are in one-to-one correspondence with the plurality of topological insulating pattern portions.

In some embodiments, the metal-organic topological insulator material includes MgAg-DCA: the first electrode is made of a magnesium silver alloy.

In some embodiments, forming a first electrode on a side of the insulating layer away from the base substrate includes: forming a plurality of first metal portions, spaced apart from each other, on the insulating layer: forming a plurality of second metal portions, spaced apart from each other, on the insulating layer: wherein the plurality of first metal portions and the plurality of second metal portions form the first electrode having a mesh structure and are arranged side by side in the first direction: each first metal portion and a second metal portion adjacent to the first metal portion have mirror symmetry: and each of each first metal portion and each second metal portion includes: a plurality of first bending portions and a plurality of second bending portions, which are alternately arranged in the second direction and bend in opposite directions: wherein the plurality of first bending portions and the plurality of second bending portions of each first metal portion and a second metal portion adjacent to the first metal portion define a plurality of meshes of the mesh structure.

In some embodiments, the manufacturing method further includes: forming a plurality of insulating protrusions, spaced from each other, on a side of the insulating layer away from the base substrate: forming a first electrode on a side of the insulating layer away from the base substrate includes: depositing a first metal layer on the insulating layer and the plurality of insulating protrusions, wherein the first metal layer includes the first electrode and a plurality of redundant electrodes, and the plurality of insulating protrusions are in one-to-one correspondence with the plurality of through holes of the first electrode: each redundant electrode is arranged on a surface of one corresponding insulating protrusion away from the base substrate, and disconnected from the first electrode.

In some embodiments, a cross-sectional area of a surface of each insulating protrusion close to the base substrate is less than that of a surface of the insulating protrusion away from the base substrate.

In some embodiments, the first electrode is formed through a physical vapor deposition process.

In some embodiments, the first electrode has a thickness of 1 nm to 1000 nm.

In some embodiments, the physical vapor deposition process is an evaporation process.

In some embodiments, forming an insulating layer on a side of the gate away from the base substrate includes: forming a first insulating sub-layer on a side of the gate electrode away from the base substrate: forming a second insulating sub-layer on a side of the first insulating sub-layer away from the base substrate: wherein the first insulating sub-layer has a dielectric constant greater than that of the second insulating sub-layer, and has a breakdown field strength less than that of the second insulating sub-layer.

In some embodiments, forming a light emitting functional layer on a side of the first electrode away from the base substrate includes: sequentially forming an electron transport layer, a light emitting layer, and a hole transport layer in a direction away from the base substrate: or sequentially forming a hole transport layer, a light emitting layer, and an electron transport layer in the direction away from the base substrate.

The embodiment of the present disclosure further provides a display substrate, which includes a plurality of the light emitting transistors.

BRIEF DESCRIPTION OF DRAWINGS

The accompanying drawings, which are provided for further understanding of the present disclosure and constitute a part of this specification, are for explaining the present disclosure together with the embodiments of the present disclosure, but are not intended to limit the present disclosure. In the drawings.

DETAIL DESCRIPTION OF EMBODIMENTS

The detailed description of the embodiments of the present disclosure will be described in further detail with reference to the accompanying drawings. It should be understood that the detailed description of the embodiments described here is only used to illustrate and explain, not limit, the present disclosure.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

A vertical organic light emitting transistor (VOLET) device can output a high current under a low operating voltage, which may better solve the problem of driving an active matrix of an organic light emitting diode. The VOFET device has a good operating performance, since a vertical structure is provided so that a length of a conductive channel of carriers can be reduced, an area of a channel for the carriers is greatly increased, and finally, the VOLET device can output the high current under the low operating voltage.

Figure 1A:
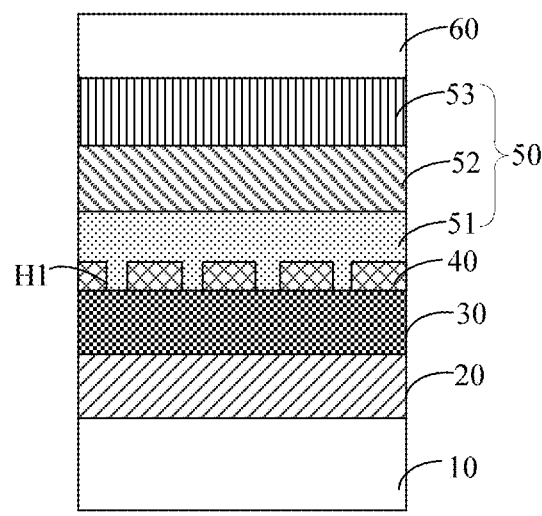
FIG. 1A is a schematic diagram of a light emitting transistor provided in some embodiments of the present disclosure.
Figure 1B:
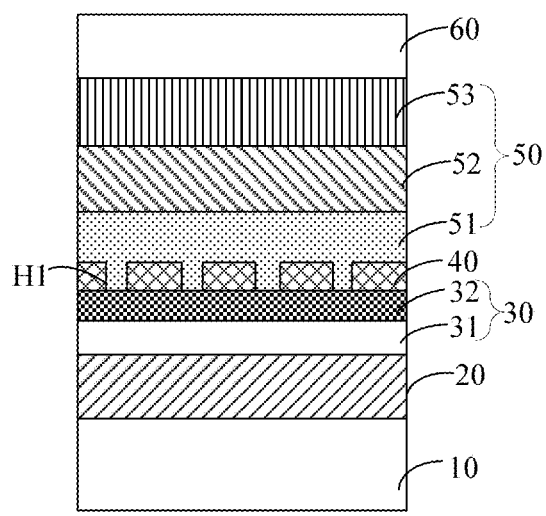
FIG. 1B is a schematic diagram of a light emitting transistor provided in other embodiments of the present disclosure.

FIG. 1A is a schematic diagram of a light emitting transistor provided in some embodiments of the present disclosure. FIG. 1B is a schematic diagram of a light emitting transistor provided in other embodiments of the present disclosure. As shown in FIGS. 1A and 1B, the light emitting transistor includes: a gate electrode 20, an insulating layer 30, a first electrode 40, a light emitting functional layer 50, and a second electrode 60. The gate electrode 20 is disposed on a base substrate 10, and may be made of a metal material such as magnesium, aluminum, or silver. The insulating layer 30 is provided on a side of the gate electrode 20 away from the base substrate 10, and may be a single layer or a plurality of layers. The first electrode 40 is disposed on a side of the insulating layer 30 away from the base substrate 10, and has a plurality of through holes H1. The light emitting functional layer 50 is disposed on a side of the first electrode 40 away from the base substrate 10, and is made of an organic material. The second electrode 60 is disposed on a side of the light emitting functional layer 50 away from the base substrate 10. The first electrode 40 may be a source electrode, and the second electrode 60 may be a drain electrode.

In some embodiments, the light emitting transistor may have a normal structure or an inverted structure. When the light emitting transistor adopts the normal structure, the light emitting functional layer 50 may include a hole transport layer 53, a light emitting layer 52, and an electron transport layer 51, which are sequentially arranged in a direction away from the base substrate 10. Alternatively, the light emitting functional layer 50 may further include: a hole injection layer between the hole transport layer 53 and the first electrode 40, and an electron injection layer between the electron transport layer 51 and the second electrode 60. When the light emitting transistor adopts the inverted structure, the light emitting functional layer 50 may include an electron transport layer 51, a light emitting layer 52, and a hole transport layer 53, which are sequentially disposed in a direction away from the base substrate 10. Alternatively, the light emitting transistor may include: an electron injection layer between the first electrode 40 and the electron transport layer 51, and a hole injection layer between the second electrode 60 and the hole transport layer 53. The light emitting layer 52 may be an organic light emitting layer or a quantum dot light emitting layer.

Figure 2A:
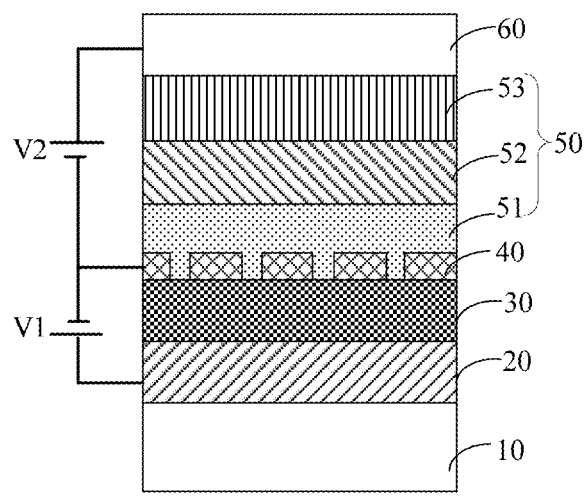
FIGS. 2A to 2C are schematic diagrams illustrating a light emitting process of a light emitting transistor provided in some embodiments of the present disclosure.
Figure 2B:
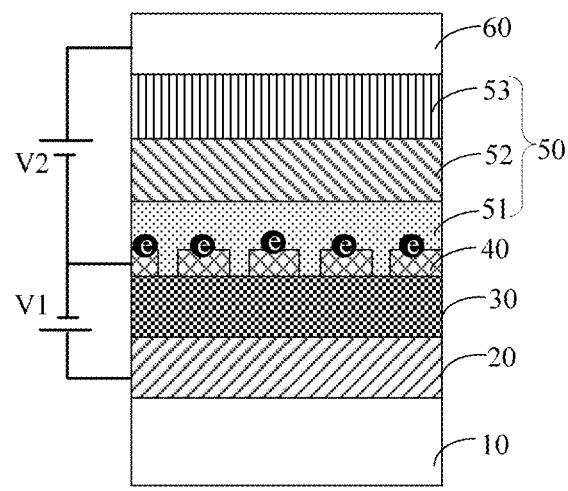
Figure 2C:
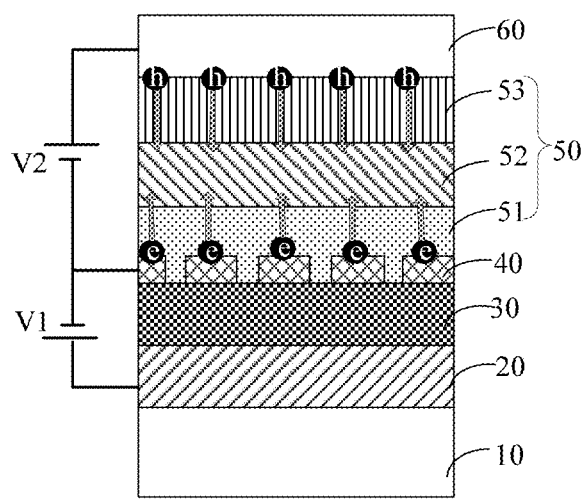

FIGS. 2A to 2C are schematic diagrams illustrating a light emitting process of a light emitting transistor provided in some embodiments of the present disclosure. FIGS. 2A to 2C illustrate a light emitting process of the light emitting transistor in a case where the light emitting transistor adopts the inverted structure. As shown in FIG. 2A, the gate electrode 20, the first electrode 40 and the insulating layer 30 between the gate electrode 20) and the first electrode 40 may be equivalent to a capacitor, so that when different voltages are applied to the gate electrode 20 and the first electrode 40 (for example, the gate electrode 20 is connected to an anode of a first power source V1, and the first electrode 40) is connected to a cathode of the first power source V1), a large amount of electrons are induced at an interface between the first electrode 40 and the insulating layer 30 under the action of an electric field, and are accumulated at an upper surface of the first electrode 40 through the through holes H1 in the first electrode 40 (as shown in FIG. 2B). When different voltages are applied to the first electrode 40 and the second electrode 60 (for example, the first electrode 40 is connected to a cathode of a second power source V2, and the second electrode 60 is connected to an anode of the second power source V2), a large number of holes are induced at an interface between the second electrode 60 and the hole transport layer 53, and are attracted by a voltage of the first electrode 40 and thus tunnel to the light emitting layer 52 with a certain probability; the electrons are attracted by a voltage of the second electrode 60, tunnel to the light emitting layer 52 with a certain probability, and recombine with holes therein, thereby emitting light. A voltage of the gate electrode 20 may be used to adjust and control the light emitting brightness.

Figure 3:
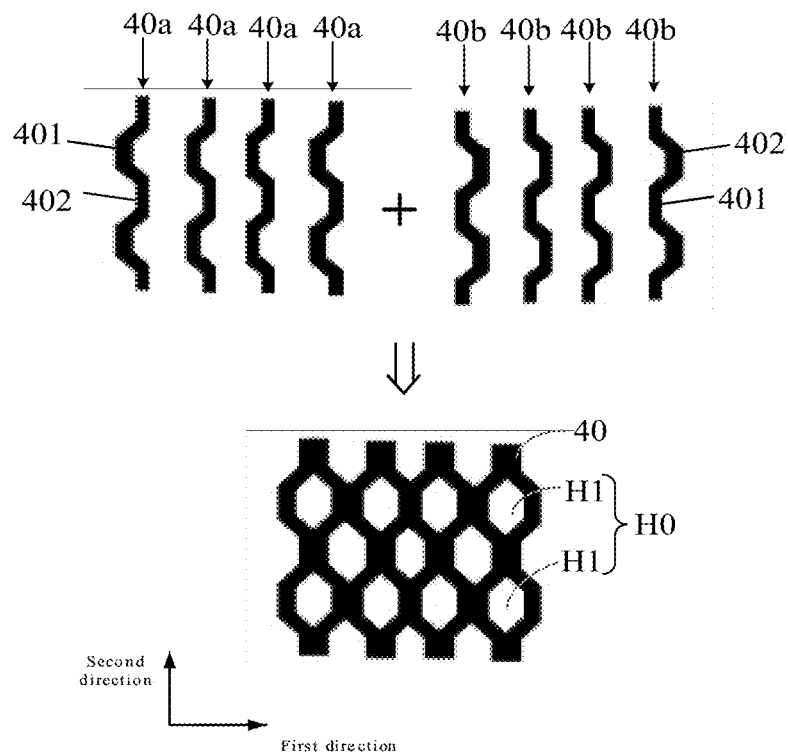
FIG. 3 is a plan view of a first electrode of a light emitting transistor provided in some embodiments of the present disclosure.

FIG. 3 is a plan view of a first electrode of a light emitting transistor provided in some embodiments of the present disclosure. In order to improve uniformity and stability of the film of the first electrode 40, as shown in FIG. 3, in the embodiment of the present disclosure, the plurality of through holes H1 of the first electrode 40 are regularly arranged. In particular, the plurality of through holes H1 of the first electrode 40 are divided into a plurality of through hole groups H0 arranged side by side along a first direction, and each through hole group H0 includes multiple through holes H1 arranged along a second direction, wherein the first direction intersects the second direction. For example, the first direction is perpendicular to the second direction. In some examples, the through holes H1 in two adjacent through hole groups H0 may be staggered with each other.

With the regular arrangement, the through holes H1 in the first electrode 40 can be distributed more uniformly, so that the film of the first electrode 40 is formed to be more uniform and stable, which advantageously improves the electrical switching characteristic of the light emitting transistor.

In the embodiment of the present disclosure, a thickness of the first electrode 40 may be between 1 nm and 1000 nm, which facilitate electrons at the interface between the first electrode 40 and the insulating layer 30 to move to an interface between the first electrode 40 and the light emitting functional layer 50. For example, the thickness of the first electrode 40 is between 1 nm and 500 nm: or between 1 nm and 200 nm: or between 1 nm and 100 nm: or between 1 nm and 50 nm; or between 1 nm and 30 nm. Preferably, the thickness of the first electrode 40 is between 1 nm and 20 nm, so that electrons are moved to the interface between the first electrode 40 and the light emitting functional layer 50 to the maximum extent. For example, the thickness of the first electrode 40 is 1 nm, 5 nm, 10 nm, 15 nm or 20 nm.

In some embodiments, an orthographic projection of each through hole H1 in the first electrode 40 on the substrate base plate 10 has a polygon shape, such as a hexagon, an octagon, a decagon or the like. Preferably, the orthographic projection of each through hole H1 in the first electrode 40 on the substrate base plate 10 has a circular or approximately circular shape. In this case, when a phototransistor is used in a display product, a diffraction phenomenon of light can be reduced, thereby improving a display effect of the display product.

A diameter of each through hole H1 may be in a range from 50 nm to 700 nm. For example, the diameter of the through hole H1 is 50 nm, 100 nm, 200 nm, 300 nm, 400 nm, 500 nm, 600 nm or 700 nm. A total opening area s1 of the plurality of through holes H1 in the first electrode 40 may be in a range from 10% to 99% of an area s2 of an orthographic projection of the gate electrode 20 on the base substrate 10. For example, s1 is in a range from 10% to 30%, 30% to 50%, 50% to 70%, 70% to 90%, or 80% to 99% of s2. The insulating layer 30 is exposed through the first electrode 40 as much as possible, thereby facilitating the entry of electrons into the light emitting layer 52.

In some embodiments, the insulating layer 30 may have a single-layer structure or a multi-layer structure. When the insulating layer 30 has a single-layer structure, the insulating layer 30 may be made of a material with a high dielectric constant, such as $Al_2O_3$ or $SiO_2$, so that the capacitor formed by the gate electrode 20, the first electrode 40, and the insulating layer 30 has a high charge storage capability. When the insulating layer 30 includes a plurality of insulating sub-layers, one of the insulating sub-layers may be made of a material with a high dielectric constant, and the remaining insulating sub-layers may be made of a material with a high breakdown field strength, so that the capacitor has a high charge storage capability and is prevented from being broken down by an electric field during a voltage across the capacitor is increasing. In one example, as shown in FIG. 1B, the insulating layer 30 includes at least a first insulating sub-layer 31 and a second insulating sub-layer 32: the first insulating sub-layer 31 is located on a side of the second insulating sub-layer 32 close to the base substrate 10, a dielectric constant of the first insulating sub-layer 31 is greater than a dielectric constant of the second insulating sub-layer 32, and a breakdown field strength of the first insulating sub-layer 31 is less than a breakdown field strength of the second insulating sub-layer 32. For example, the first insulating sub-layer 31 and the second insulating sub-layer 32 are selected from a $Ta_2O_3$ layer or a $SiO_2$ layer: alternatively, the first insulating sub-layer 31 and the second insulating sub-layer 32 are selected from a $Y_2O_3$ layer or a $SiO_2$ layer; alternatively, the first insulating sub-layer 31 and the second insulating sub-layer 32 are selected from an $Al_2O_3$ layer or an $SiO_2$ layer.

In some embodiments, the light emitting transistor may be a bottom emission structure or a top emission structure. When the light emitting transistor adopts a bottom emission structure, the second electrode 60 may be made of a metal material having a high reflectivity, such as aluminum: the gate electrode 20 may be made of a transparent conductive material such as Indium Tin Oxide (ITO). The first electrode 40 has a small thickness, which does not affect the light emission. When the light emitting transistor adopts a top emission structure, the gate electrode 20 may be made of a metal material having a high reflectivity, such as aluminum: the second electrode 60 may be made of a transparent conductive material such as ITO.

FIG. 3 is a plan view of a first electrode of a light emitting transistor provided in some embodiments of the present disclosure. As shown in FIG. 3, the first electrode 40 includes a plurality of metal portions, including a plurality of first metal portions 40a arranged side by side in the first direction and a plurality of second metal portions 40b arranged side by side in the first direction: the plurality of first metal portions 40a and the plurality of second metal portions 40b are alternately arranged one by one. The plurality of first metal portions 40a and the plurality of second metal portions 40b constitute a mesh structure. Each of the first and second metal portions 40a and 40b includes a plurality of first bending portions 401 and a plurality of second bending portions 402, the first bending portions 401 and the second bending portions 402 in each of the first and second metal portions 40a and 40b are alternately arranged in the second direction, and are bent toward opposite directions. The first direction intersects, e.g., is perpendicular to, the second direction. The plurality of first bending portions 401 and the plurality of second bending portions 402 in every two adjacent metal portions define a plurality of meshes (i.e., the through holes H1) of the mesh structure.

When forming the first electrode 40 shown in FIG. 3, the plurality of first metal portions 40a may be formed by using a first mask, and then the plurality of second metal portions 40b may be formed by using a second mask, so as to obtain the first electrode 40 having the mesh structure.

Figure 4A:
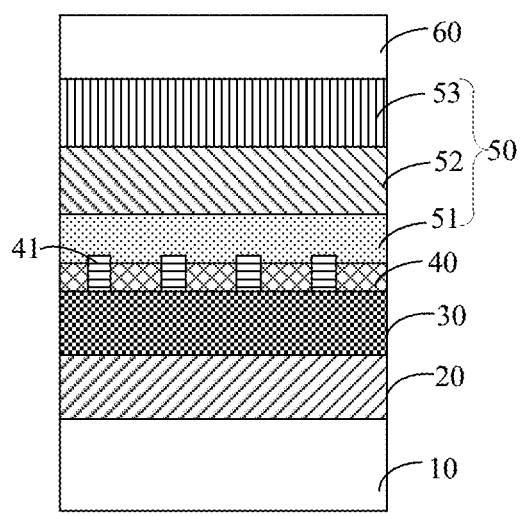
FIG. 4A is a schematic diagram of a light emitting transistor provided in still further embodiments of the present disclosure.
Figure 4B:
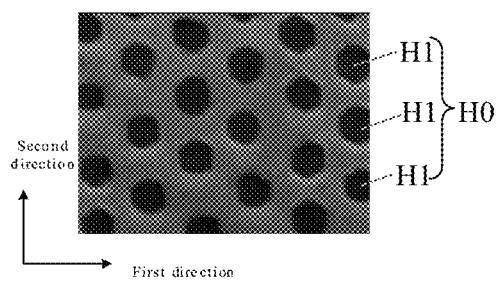
FIG. 4B is an electron microscopy of a light emitting transistor provided in still further embodiments of the present disclosure.

FIG. 4A is a schematic diagram of a light emitting transistor provided in still further embodiments of the present disclosure. FIG. 4B is an electron microscopy of a light emitting transistor provided in still further embodiments of the present disclosure. Like the light emitting transistor in FIG. 1A, a light emitting transistor in FIG. 4A includes a gate electrode 20, an insulating layer 30, a first electrode 40, a light emitting functional layer 50 and a second electrode 60, which are sequentially arranged in a direction away from a base substrate 10. The light emitting functional layer 50 includes an electron transport layer 51, a light emitting layer 52 and a hole transport layer 53 which are sequentially arranged in the direction away from the base substrate 10; alternatively, the light emitting functional layer 50 includes a hole transport layer 53, a light emitting layer 52, and an electron transport layer 51, which are sequentially arranged in the direction away from the base substrate 10.

Like the light emitting transistor in FIG. 1A, a thickness of the first electrode 40 of the light emitting transistor in FIG. 4A is between 1 nm and 1000 nm. Preferably, the thickness of the first electrode 40 is between 1 nm and 20 nm, so as to facilitate the formation of the through holes H1 in the first electrode 40. As shown in FIG. 4B, the through holes H1 are divided into a plurality of through hole groups H0 distributed along the first direction: each through hole group H0 includes multiple through holes H1 arranged along the second direction. The shape and the size of each through hole H1 may be referred to the description of FIG. 1A, and are not repeated here. The insulating layer 30 may be a single-layer structure shown in FIG. 1A or a multi-layer structure shown in FIG. 1B, and the specific material of the insulating layer 30 may be referred to the description of FIGS. 1A and 1B, and is not described herein again.

Unlike the light emitting transistor in FIG. 1A, the light emitting transistor shown in FIG. 4A may further include a topological insulating pattern layer, including a plurality of topological insulating pattern portions 41 spaced apart from each other and in one-to-one correspondence with the through holes H1 in the first electrode 40. It should be noted that the topological insulating pattern portions 41 are arranged in one-to-one correspondence with the through holes H1 in the first electrode 40, that is, each topological insulating pattern portion 41 corresponds to one through hole H1, different topological insulating pattern portions 41 correspond to different through holes H1, and each topological insulating pattern portion 41 may be located in a corresponding through hole H1.

The topological insulating pattern portions 41 are made of a metal-organic topological insulator material: the first electrode 40 is made of a metal material, and the metal element in the metal material is the same as the metal element in the metal-organic topological insulator material. The topological insulating pattern portions 41 are made of the metal-organic topological insulator material, so that it is possible to prevent a specific metal element from growing on surfaces of the topological insulating pattern portions 41, thereby facilitating formation of the first electrode having the plurality of through holes H1 therein.

When forming the first electrode 40 of the light emitting transistor shown in FIG. 4A, the plurality of topological insulating pattern portions 41 may be formed on the insulating layer 30 firstly, wherein a shape and a size of an orthographic projection of each topological insulating pattern portion 41 on the base substrate 10 may be the same as those of a corresponding through hole H1 in the first electrode 40 to be formed, respectively, and a height of each topological insulating pattern portion 41 may be greater than or equal to a thickness of the first electrode 40 to be formed. Then, a metal material, a metal element of which is the same as that of the metal-organic topological insulator material, may be deposited through a Physical Vapor Deposition (PVD) process, such that the metal material is deposited outside an area where the topological insulating pattern portions 41 are located, thereby forming the first electrode 40 having the through holes H1 therein.

Figure 4C:
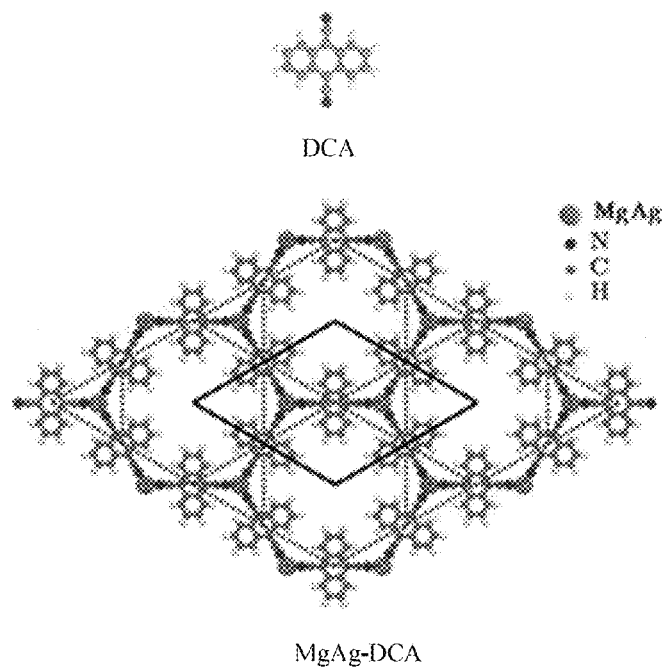
FIG. 4C is a schematic diagram of a structure of a DCA molecule and a structure of MgAg-DCA metal organic lattices.

In some examples, the metal-organic topological insulator material includes MgAg-DCA (dicyanoanthracene). FIG. 4C is a schematic diagram of a structure of a DCA molecule and a structure of a MgAg-DCA metal organic lattice. In FIG. 4C, different dots represent different atoms. When the topological insulator material employs MgAg-DCA, the first electrode 40 may be made of magnesium silver alloy.

Figure 5:
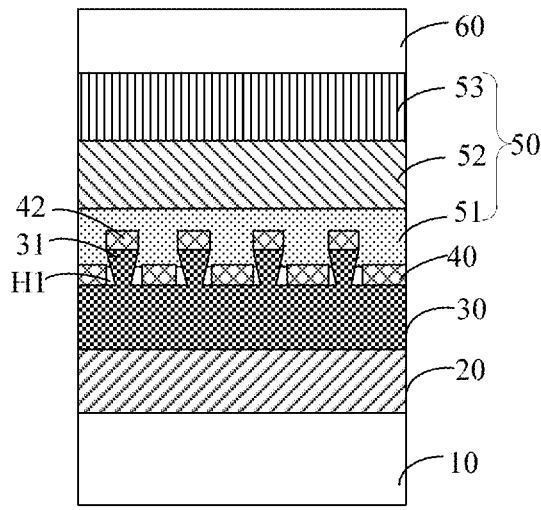
FIG. 5 is a schematic diagram of a light emitting transistor provided in still other embodiments of the present disclosure.

FIG. 5 is a schematic diagram of a light emitting transistor provided in still other embodiments of the present disclosure. Like the light emitting transistor in FIG. 1A, a light emitting transistor in FIG. 5 includes a gate electrode 20, an insulating layer 30, a first electrode 40, a light emitting functional layer 50 and a second electrode 60, which are sequentially arranged in a direction away from a base substrate 10. The light emitting functional layer 50 includes an electron transport layer 51, a light emitting layer 52 and a hole transport layer 53 which are sequentially arranged in the direction away from the base substrate 10: alternatively, the light emitting functional layer 50 includes a hole transport layer 53, a light emitting layer 52, and an electron transport layer 51, which are sequentially arranged in the direction away from the base substrate 10.

Like the light emitting transistor in FIG. 1A, a thickness of the first electrode 40) of the light emitting transistor in FIG. 5A is between 1 nm and 1000 nm. Preferably, the thickness of the first electrode 40 is between 1 nm and 20 nm, so as to facilitate the formation of the through holes H1 in the first electrode 40. The shape and the size of each through hole H1 and the structure and the material of the insulating layer 30 may be referred to the description of FIG. 1A, and are not repeated here.

Unlike the light emitting transistor in FIG. 1A, in the light emitting transistor shown in FIG. 5, a plurality of insulating protrusions 31 may be provided on a side of the insulating layer 30 away from the base substrate 10 and spaced apart from each other; and the plurality of insulating protrusions 31 and at least a portion of the insulating layer 30 may have a one-piece structure. For example, when the insulating layer 30 has a single-layer structure, the plurality of insulating protrusions 31 and the insulating layer 30 may have a one-piece structure: when the insulating layer 30 includes the plurality of insulating sub-layers, the plurality of insulating protrusions 31 and an insulating sub-layer farthest from the base substrate 10 may have a one-piece structure. Each of the insulating protrusions 31 may correspond to one through hole H1, and different insulating protrusions 31 correspond to different through holes H1.

As shown in FIG. 5, the light emitting transistor includes a first metal layer, including the first electrode 40 and a plurality of redundant electrodes 42: each redundant electrode 42 is disposed on a surface of one corresponding insulating protrusion 31 away from the base substrate 10, and different redundant electrodes 42 are disposed on different insulating protrusions 31.

The first electrode 40 and the redundant electrodes 42 may be made of a metal material, such as Ag, Cu, Al, or the like. When manufacturing the redundant electrodes 42 and the first electrode 40 simultaneously, a metal material is deposited on the base substrate 10 on which the insulating layer 30 and the insulating protrusions 31 are formed through a PVD process such as a vapor deposition process, wherein a part of the metal material is deposited on the insulating protrusions 31, thereby forming the redundant electrodes 42: the other part of the metal material is deposited on a region of the insulating layer 30 where the insulating protrusions 31 are absent, thereby forming the first electrode 40. Each insulating protrusion 31 has a height, which satisfies the following condition: the redundant electrodes 42 are disconnected from the first electrode 40 when the first metal layer is formed through the PVD process. For example, the height of each insulating protrusion 31 is 1.2 to 2 times, or 2 to 4 times the thickness of the first electrode 40.

When the first electrode 40 and the redundant electrodes 42 are formed, the deposited metal material is thin, for example, has a thickness of not more than 1000 nm, thereby facilitating the disconnection of the redundant electrodes 42 from the first electrode 40. Illustratively, the thickness of the deposited metal material is between 1 nm and 500 nm: or between 1 nm and 200 nm; or between 1 nm and 100 nm: or between 1 nm and 50 nm; or between 1 nm and 30 nm. Preferably, the thickness of the metal material is between 1 nm and 20 nm. In addition, a cross-sectional area of a surface of each insulating protrusion 31 close to the base substrate 10 is less than that of a surface of the insulating protrusion 31 away from the base substrate 10, which also facilitates the disconnection of the redundant electrodes 42 from the first electrode 40. In some examples, a longitudinal cross-section of each insulating protrusion 31 has an inverted trapezoidal or a "T" shape. The "cross-sectional area" refers to an area parallel to a cross-section of the base substrate 10, and the "longitudinal cross-section" refers to a cross-section perpendicular to the base substrate 10.

It is noted that in some embodiments, the redundant electrodes 42 may also be removed after the first electrode 40 and the redundant electrodes 42 are formed; alternatively, the redundant electrodes 42 and the insulating protrusions 31 are removed together after the first electrode 40 and the redundant electrodes 42 are formed.

Figure 6:
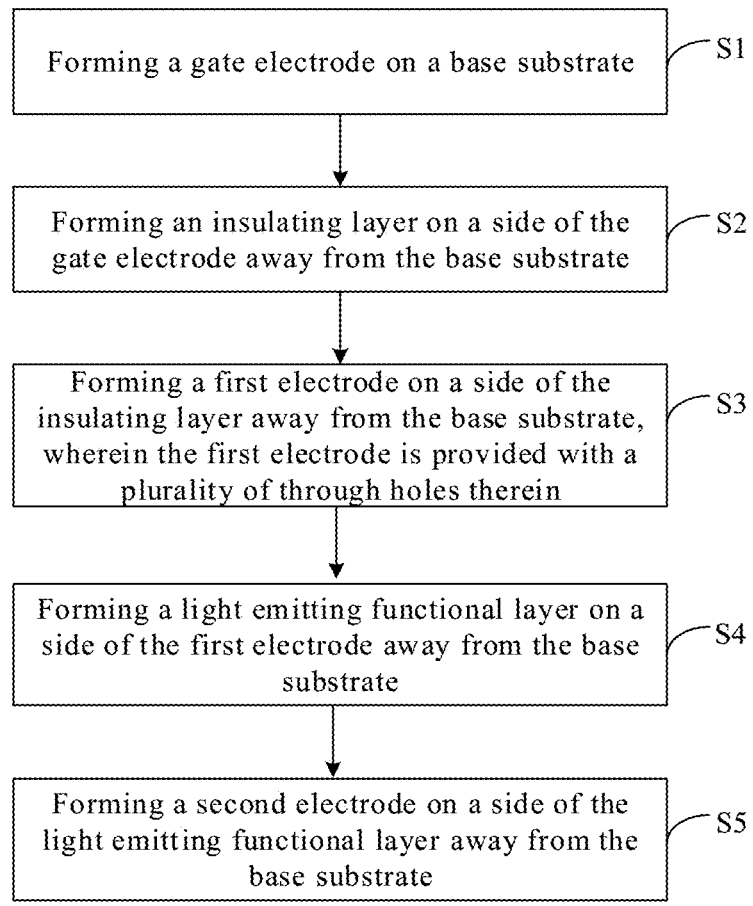
FIG. 6 is a flow chart of a method for manufacturing a light emitting transistor provided in some embodiments of the present disclosure.

FIG. 6 is a flow chart of a method for manufacturing a light emitting transistor provided in some embodiments of the present disclosure. As shown in FIG. 6, the method for manufacturing a light emitting transistor includes:

S1, forming a gate electrode on a base substrate.

S2, forming an insulating layer on a side of the gate electrode away from the base substrate.

S3, forming a first electrode on a side of the insulating layer away from the base substrate, wherein the first electrode is provided with a plurality of through holes, which are divided into a plurality of through hole groups arranged side by side in a first direction: each through hole group includes multiple through holes arranged in a second direction, and the first direction intersects the second direction.

S4, forming a light emitting functional layer on a side of the first electrode away from the base substrate.

S5, forming a second electrode on a side of the light emitting functional layer away from the base substrate.

The first electrode may be a source electrode, and the second electrode may be a drain electrode.

In the manufacturing method provided by the embodiment of the present disclosure, the first electrode of the manufactured light emitting transistor is provided with the regularly arranged plurality of through holes, so that the through holes H1 in the first electrode 40 are distributed more uniformly, and further, the film of the first electrode is formed more uniformly and stably, which is beneficial to improving the electrical switching characteristics of the light emitting transistor.

The manufacturing method in the embodiment of the present disclosure will be described below in detail with reference to the drawings.

Figure 7:
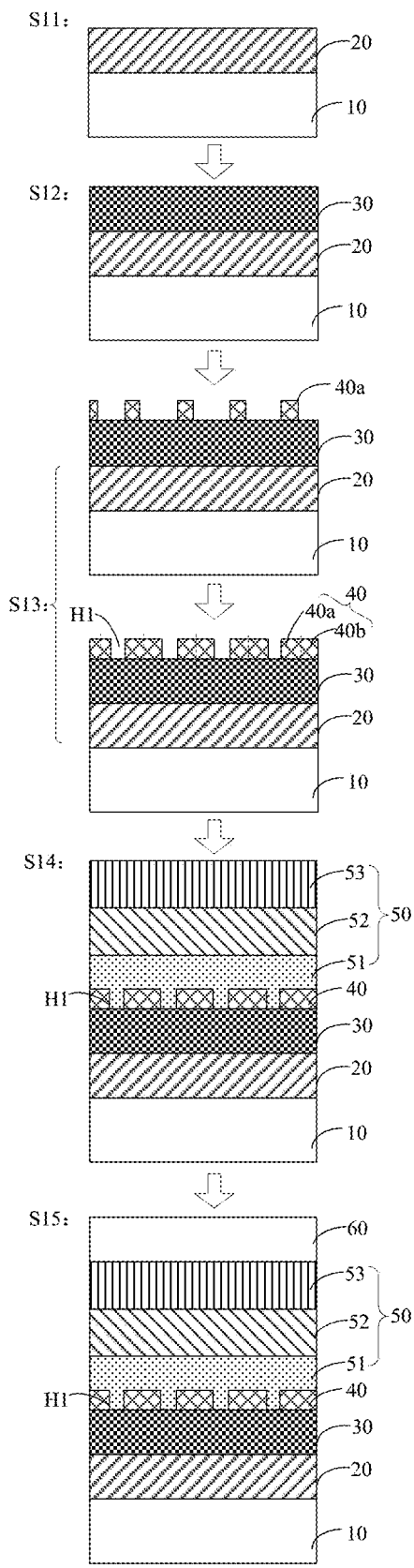
FIG. 7 is a schematic diagram illustrating structures corresponding to a method for manufacturing a light emitting transistor provided in some embodiments of the present disclosure.

FIG. 7 is a schematic diagram illustrating structures corresponding to a method for manufacturing a light emitting transistor provided in some embodiments of the present disclosure. As shown in FIG. 7, the method for manufacturing a light emitting transistor includes steps:

S11, forming the gate electrode 20 on the base substrate 10.

In the step S11, the gate electrode 20 may be formed on the base substrate 10 through a PVD process. For example, the gate electrode 20 may be formed through an evaporation or sputtering process. When the light emitting transistor has the bottom emission structure, the gate electrode 20 may be made of a transparent conductive material such as ITO.

S12, forming the insulating layer 30 on the side of the gate electrode 20 away from the base substrate 10.

In the step S12, the insulating layer 30 may be formed through the PVD process or a Chemical Vapor Deposition (CVD) process or an Atomic Layer Deposition (ALD) process. The insulating layer 30 may have a single-layer structure, or may include a plurality of insulating sub-layers, and the specific material of the insulating layer 30 may be referred to the above description, and will not be described herein again.

S13, forming the first electrode 40 on the side of the insulating layer 30 away from the base substrate 10 through the PVD process, wherein the first electrode 40 is provided with the plurality of through holes H1.

Figure 8:
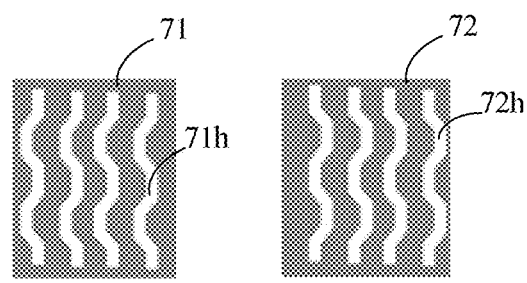
FIG. 8 is a plan view of a first mask and a second mask provided in an embodiment of the present disclosure.

The first electrode 40 may have the mesh structure as shown in FIG. 3, and in this case, the first electrode 40 having the through holes H1 may be formed using a first mask and a second mask. FIG. 8 is a plan view of a first mask and a second mask provided in an embodiment of the present disclosure. As shown in FIG. 8, the first mask 71 has a plurality of first openings 71h spaced apart from each other, and the second mask 72 has a plurality of second openings 72h spaced apart from each other. In the step S13, a metal material may be deposited on the insulating layer 30 by using the first mask 71 to form a plurality of first metal portions 40a spaced from each other, and the specific shape of each of the first metal portions 40a may be referred to the description of FIG. 3: then, a metal material is deposited on the insulating layer 30 by using the second mask 72, so as to form a plurality of second metal portions 40b spaced from each other, wherein the specific shape of each of the second metal portions 40b may be referred to the description of FIG. 3, and the plurality of first metal portions 40a and the plurality of second metal portions 40b form the mesh-shaped first electrode 40 (as shown in FIG. 3). When forming the first metal portions 40a and the second metal portions 40b, the evaporation process may be used. That is, when the first metal portions 40a are formed, the first mask 71 is placed between the base substrate 10 and an evaporation source, and the metal material in the evaporation source is heated and thus, sublimated into gaseous particles, and pass to the base substrate 10 through the first openings 71h, thereby forming the first metal portions 40a: when the second metal portions 40b are formed, the second mask is placed between the base substrate 10 and the evaporation source, and the metal material in the evaporation source is heated and thus, sublimated into gaseous particles, and pass to the base substrate 10 through the second openings 72h, thereby forming the second metal portions 40b.

S14, forming the light emitting functional layer 50 on the side of the first electrode 40 away from the base substrate 10.

For the inverted light emitting transistor, the step S14 may include: sequentially forming an electron transport layer 51, a light emitting layer 52, and a hole transport layer 53 in a direction away from the base substrate 10 are. In addition, it is also possible to form an electron injection layer before the electron transport layer 51 is formed and to form a hole injection layer after the hole transport layer 53 is formed.

For a normal light emitting transistor, the step S14 may include: sequentially forming a hole transport layer 53, a light emitting layer 52, and an electron transport layer 51 in the direction away from the base substrate 10. In addition, it is also possible to form a hole injection layer before the hole transport layer 53 is formed and to form an electron injection layer after the electron transport layer 51 is formed.

S15, forming the second electrode 60 on the side of the light emitting functional layer 50 away from the base substrate 10.

In the step S15, the second electrode 60 may be formed on the base substrate 10 through the PVD process. For example, the second electrode 60 may be formed through the evaporation or sputtering process. When the light emitting transistor has the bottom emission structure, the second electrode 60 may be made of a metal material: and when the light emitting transistor has the top emission structure, the second electrode 60 may be made of a transparent conductive material such as ITO.

Figure 9:
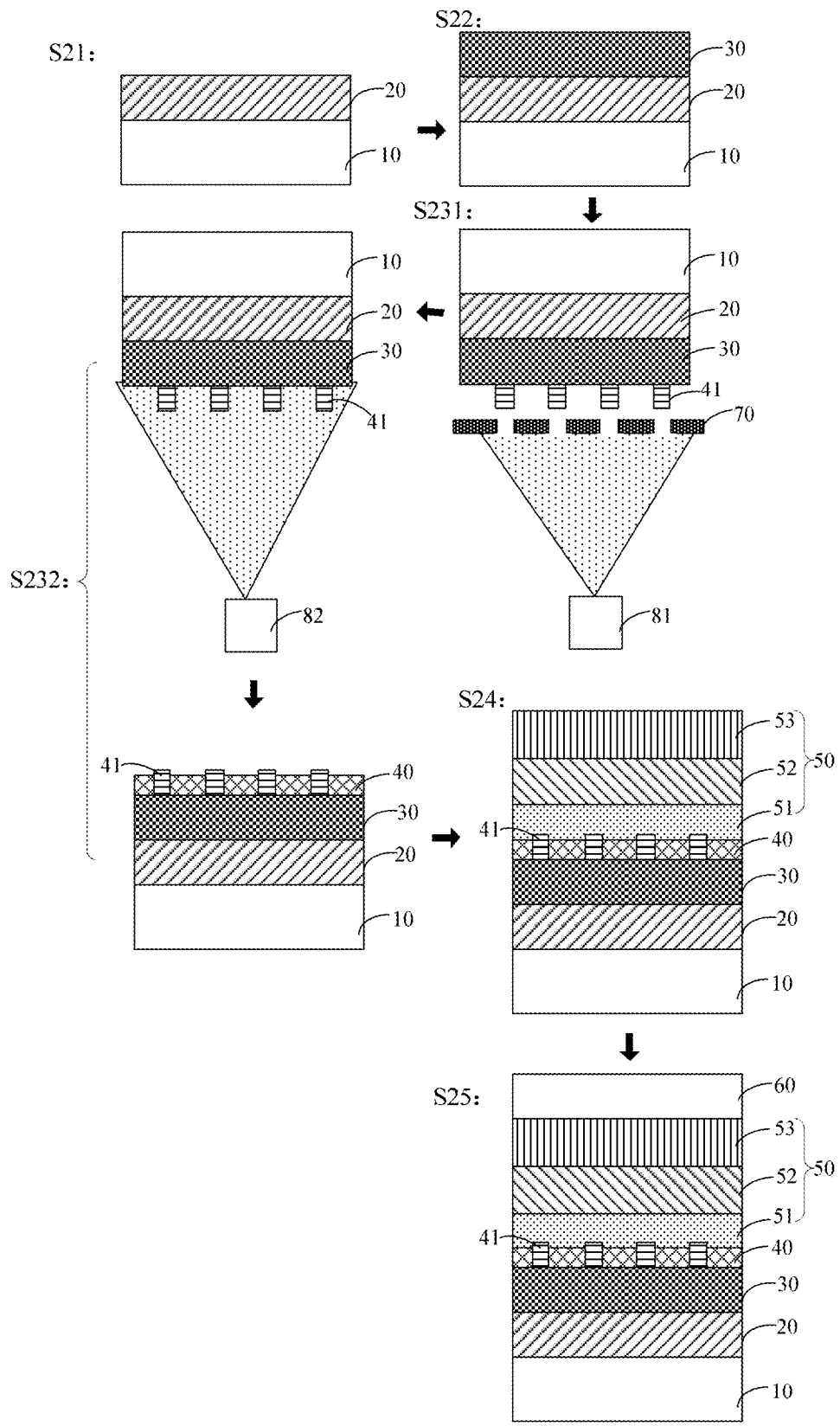
FIG. 9 is a schematic diagram illustrating structures corresponding to a method for manufacturing a light emitting transistor provided in another embodiment of the present disclosure.

FIG. 9 is a schematic diagram illustrating structures corresponding to a method for manufacturing a light emitting transistor provided in another embodiment of the present disclosure. As shown in FIG. 9, the method for manufacturing a light emitting transistor includes steps:

S21, forming the gate electrode 20 on the base substrate 10. The step S21 is the same as the step S11, and will not be described herein.

S22, forming the insulating layer 30 on the side of the gate electrode 20 away from the base substrate 10. The step S22 is the same as the step S12, and will not be described herein.

S23, forming the first electrode 40 on the side of the insulating layer 30 away from the base substrate 10 through the PVD process. The PVD process may be specifically an evaporation process, and the step S23 may specifically include steps S231 to S232:

S231, forming a topological insulating pattern layer on a side of the insulating layer 30 away from the base substrate 10, the topological insulating pattern layer including a plurality of topological insulating pattern portions 41 spaced apart from each other and made of a metal-organic topological insulator material.

In the step S231, the plurality of topological insulating pattern portions 41 may be formed through the vapor deposition process. As shown in FIG. 9, a mask 70 is disposed between the insulating layer 30 and a vapor deposition source 81, and a material in the vapor deposition source 81 is heated and sublimated into gaseous particles, which are attached to the insulating layer 30 through the openings of the mask 70.

S232, evaporating a metal material, wherein the metal element in the metal material is the same as that in the metal-organic topological insulator material, so that the metal material is not formed on surfaces of the topological insulating pattern portions 41, but is deposited in an area where the topological insulating pattern portions 41 are not formed, thereby forming the first electrode 40 having the through holes H1, wherein the through holes H1 are in one-to-one correspondence with the topological insulating pattern portions 41. In step S232, the vapor deposition source 82 is provided with the metal material, and thus, the mask is not required to be provided during the vapor deposition.

S24, forming the light emitting functional layer 50 on the side of the first electrode 40 away from the base substrate 10. The step S24 may be the same as the step S14, and will not be described here.

S25, forming the second electrode 60 on the side of the light emitting functional layer 50 away from the base substrate 10. The step S25 may be the same as the step 15, and will not be described here.

Figure 10:
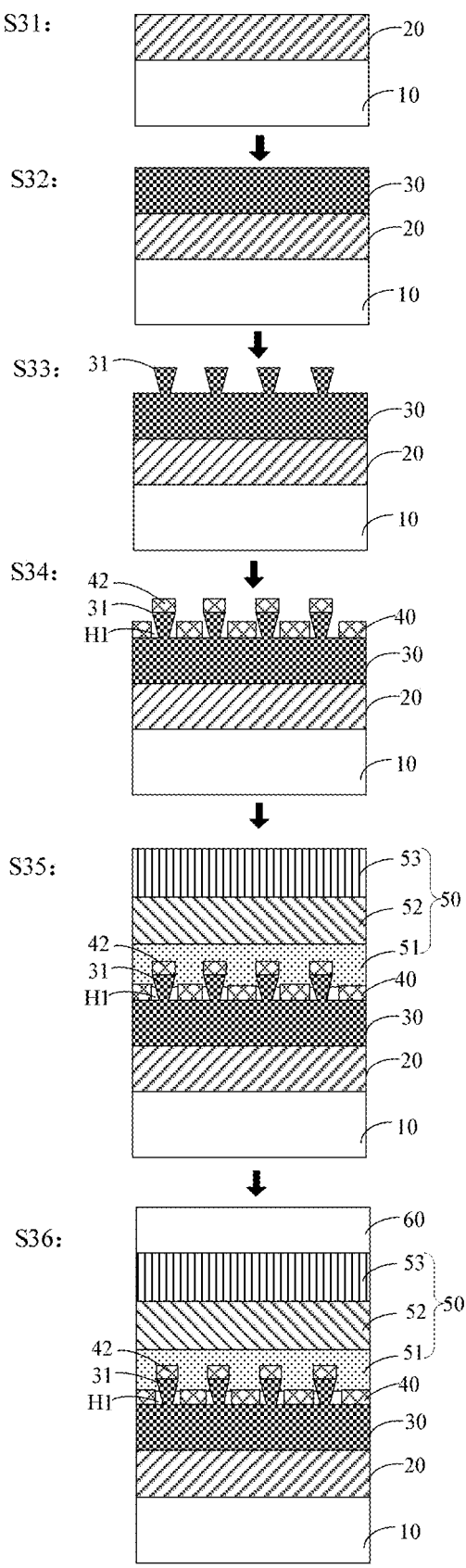
FIG. 10 is a schematic diagram illustrating structures corresponding to a method for manufacturing a light emitting transistor provided in still other embodiments of the present disclosure.

FIG. 10 is a schematic diagram illustrating structures corresponding to a method for manufacturing a light emitting transistor provided in still other embodiments of the present disclosure. As shown in FIG. 10, the method for manufacturing a light emitting transistor includes steps:

S31, forming the gate electrode 20 on the base substrate 10. The step S31 may be the same as the step S11, and will not be described here.

S32, forming the insulating layer 30 on the side of the gate electrode 20 away from the base substrate 10. The step S32 may be the same as the step S12, and will not be described here.

S33, forming a plurality of insulating protrusions 31 on the side of the insulating layer 30 away from the base substrate 10. The height and size of each insulating protrusion 31 may be set with a reference to the description of FIG. 5, and are not described here.

Specifically, the step S33 may include: forming an insulating material layer on a side of the insulating layer 30 away from the base substrate 10, and etching the insulating material layer, thereby forming the plurality of insulating protrusions 31. Alternatively, the insulating layer 30 formed at step S32 is etched, thereby forming the plurality of insulating protrusions 31.

S34, forming the first electrode 40 on the side of the insulating layer 30 away from the base substrate 10 through the PVD process, wherein the first electrode 40 is a metal electrode provided with the plurality of through holes H1.

Specifically, the step S34 may include: depositing a metal material on the insulating layer 30 and the plurality of insulating protrusions 31 through the PVD process, thereby forming a first metal layer including the first electrode 40 and a plurality of redundant electrodes 42: each redundant electrode 42 is disposed on a surface of one insulating protrusion 31 away from the base substrate 10; the first electrode 40 is located on a region of the insulating layer where no insulating protrusion 31 is formed, and the through holes H1 in the first electrode 40 are in one-to-one correspondence with the insulating protrusions 31.

It should be noted that the height of each insulating protrusion 31 formed in the step S33 should satisfy the following condition: when the first metal layer is formed through the PVD process, the first electrode 40 is disconnected from the redundant electrodes 42.

S35, forming the light emitting functional layer 50 on the side of the first electrode 40 away from the base substrate 10. The step S35 may be the same as the step S14, and will not be described here.

S36, forming the second electrode 60 on the side of the light emitting functional layer 50 away from the base substrate 10. The step S36 may be the same as the step S15, and will not be described here.

In further embodiments, after the first metal layer is formed, the redundant electrodes 42 on the insulating protrusions 31 may also be removed. Only the redundant electrodes 42 may be removed. Alternatively, the redundant electrodes 42 and the insulating protrusions 31 may be both removed. For example, when the insulating protrusions 31 are formed, the insulating protrusions 31 are formed of a photoresist material which is easily peeled off, and when the redundancy electrodes 42 are removed, the insulating protrusions 31 and the redundancy electrodes 42 are removed together by peeling off the photoresist.

In the manufacturing method provided by the embodiment of the present disclosure, the first electrode of the manufactured light emitting transistor is provided with the plurality of through holes, which are regularly arranged, so that the through holes H1 in the first electrode 40 are distributed more uniformly, and further, the film of the first electrode can be formed to be more uniform and stable, which is beneficial to improving the electrical switching characteristics of the light emitting transistor. In addition, the first electrode 40 is formed through the PVD process, so that the first electrode 40 formed through the PVD process is a film with a better uniformity and stability than that formed through a solution method, which is beneficial to further improving the electrical switching characteristics of the light emitting transistor.

The embodiment of the present disclosure further provides a display substrate, which includes a plurality of light emitting transistors in the above embodiments.

The display substrate may include a plurality of sub-pixels, for example, a plurality of red sub-pixels, a plurality of green sub-pixels, and a plurality of blue sub-pixels, each of the sub-pixels may be provided with the light emitting transistor; areas of the sub-pixels of different colors may be the same or different. When the areas of the sub-pixels of different colors are the same, a total area of the through holes in the first electrodes in the different sub-pixels may be the same; when the areas of the sub-pixels of different colors are different, the total area of the through holes in the first electrode in each sub-pixel may be positively correlated with an area of the sub-pixel.

The light emitting transistor in the embodiment of the present disclosure has better electrical characteristics, so that the display substrate by adopting the light emitting transistor has better display effects.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A light emitting transistor, comprising:
a gate electrode on a base substrate;
an insulating layer on a side of the gate electrode away from the base substrate;
a first electrode on a side of the insulating layer away from the base substrate, wherein the first electrode is provided with a plurality of through holes therein, which are divided into a plurality of through hole groups arranged side by side in a first direction; each through hole group comprises multiple through holes arranged in a second direction, the first direction intersects the second direction;
a light emitting functional layer on a side of the first electrode away from the base substrate; and
a second electrode on a side of the light emitting functional layer away from the base substrate; and
wherein the light emitting transistor further comprises a topological insulating pattern layer on the insulating layer and comprising a plurality of topological insulating pattern portions spaced apart from each other,
wherein the plurality of topological insulating pattern portions are in one-to-one correspondence with the plurality of through holes and are made of a metal-organic topological insulator material,
the first electrode is made of a metal material, and
a metal element in the metal material is the same as that in the metal-organic topological insulator material.

2. The light emitting transistor of claim 1, wherein
the metal-organic topological insulator material comprises MgAg-DCA, and
the first electrode is made of a magnesium silver alloy material.

3. The light emitting transistor of claim 1, wherein an orthographic projection of each through hole on the base substrate is polygonal or substantially circular.

4. The light emitting transistor of claim 1, wherein the first electrode has a thickness in a range of 1 nm to 1000 nm.

5. The light emitting transistor of claim 1, wherein
the insulating layer comprises at least: a first insulating sub-layer and a second insulating sub-layer,
wherein the first insulating sub-layer is on a side of the second insulating sub-layer close to the base substrate; and
the first insulating sub-layer has a dielectric constant greater than that of the second insulating sub-layer, and has a breakdown field strength less than that of the second insulating sub-layer.

6. The light emitting transistor of claim 1, wherein
the light emitting functional layer comprises: an electron transport layer, a light emitting layer, and a hole transport layer, which are sequentially arranged in a direction away from the base substrate; or the light emitting functional layer comprises a hole transport layer, a light emitting layer, and an electron transport layer, which are sequentially arranged in the direction away from the base substrate.

7. A method for manufacturing the light emitting transistor of claim 1, comprising:
forming a gate electrode on a base substrate;
forming an insulating layer on a side of the gate electrode away from the base substrate;
forming a first electrode on a side of the insulating layer away from the base substrate, wherein the first electrode is provided with a plurality of through holes therein, which are divided into a plurality of through hole groups arranged side by side in a first direction; each through hole group comprises multiple through holes arranged in a second direction, the first direction intersects the second direction;
forming a light emitting functional layer on a side of the first electrode away from the base substrate; and
forming a second electrode on a side of the light emitting functional layer away from the base substrate.

8. The manufacturing method of claim 7, wherein the forming a first electrode on a side of the insulating layer away from the base substrate comprises:
forming a topological insulating pattern layer on a side of the insulating layer away from the base substrate, wherein the topological insulating pattern layer comprises a plurality of topological insulating pattern portions spaced apart from each other and are made of a metal-organic topological insulator material; and
depositing a metal material on the insulating layer to form the first electrode provided with the plurality of through holes,
wherein a metal element in the metal material is the same as that in the metal-organic topological insulator material, and
the plurality of through holes are in one-to-one correspondence with the plurality of topological insulating pattern portions.

9. The manufacturing method of claim 8, wherein
the metal-organic topological insulator material comprises MgAg-DCA; and
the first electrode is made of a magnesium silver alloy material.

10. The manufacturing method of claim 7, wherein the first electrode is formed through a physical vapor deposition process.

11. The manufacturing method of claim 7, wherein the forming an insulating layer on a side of the gate away from the base substrate comprises:
forming a first insulating sub-layer on a side of the gate electrode away from the base substrate; and
forming a second insulating sub-layer on a side of the first insulating sub-layer away from the base substrate; and
wherein the first insulating sub-layer has a dielectric constant greater than that of the second insulating sub-layer, and has a breakdown field strength less than that of the second insulating sub-layer.

12. The manufacturing method of claim 7, wherein the forming a light emitting functional layer on a side of the first electrode away from the base substrate comprises:
sequentially forming an electron transport layer, a light emitting layer, and a hole transport layer in a direction away from the base substrate; or
sequentially forming a hole transport layer, a light emitting layer, and an electron transport layer in the direction away from the base substrate.

13. A display substrate, comprising a plurality of light emitting transistors, each of which is the light emitting transistor of claim 1.

14. A light emitting transistor, comprising:
a gate electrode on a base substrate;
an insulating layer on a side of the gate electrode away from the base substrate;
a first electrode on a side of the insulating layer away from the base substrate, wherein the first electrode is provided with a plurality of through holes therein, which are divided into a plurality of through hole groups arranged side by side in a first direction; each through hole group comprises multiple through holes arranged in a second direction, the first direction intersects the second direction;
a light emitting functional layer on a side of the first electrode away from the base substrate; and
a second electrode on a side of the light emitting functional layer away from the base substrate, wherein
a plurality of insulating protrusions are arranged on a surface of the insulating layer away from the base substrate and spaced apart from each other, and are in one-to-one correspondence with the plurality of through holes;
the light emitting transistor comprises a first metal layer comprising the first electrode and a plurality of redundant electrodes; and
each redundant electrode is arranged on a surface of one corresponding insulating protrusion away from the base substrate, and is disconnected from the first electrode.

15. The light emitting transistor of claim 14, wherein a cross-sectional area of a surface of each insulating protrusion close to the base substrate is less than that of a surface of the insulating protrusion away from the base substrate.

16. A method for manufacturing the light emitting transistor of claim 14, comprising:
forming a gate electrode on a base substrate;
forming an insulating layer on a side of the gate electrode away from the base substrate;
forming a first electrode on a side of the insulating layer away from the base substrate, wherein the first electrode is provided with a plurality of through holes therein, which are divided into a plurality of through hole groups arranged side by side in a first direction; each through hole group comprises multiple through holes arranged in a second direction, the first direction intersects the second direction;
forming a light emitting functional layer on a side of the first electrode away from the base substrate; and
forming a second electrode on a side of the light emitting functional layer away from the base substrate, wherein
the manufacturing method further comprises: forming a plurality of insulating protrusions, spaced from each other, on a side of the insulating layer away from the base substrate;
the forming a first electrode on a side of the insulating layer away from the base substrate comprises:
depositing a first metal layer on the insulating layer and the plurality of insulating protrusions,
wherein the first metal layer comprises the first electrode and a plurality of redundant electrodes,
the plurality of insulating protrusions are in one-to-one correspondence with the plurality of through holes of the first electrode; and
each redundant electrode is arranged on a surface of one corresponding insulating protrusion away from the base substrate, and disconnected from the first electrode.

17. The manufacturing method of claim 16, wherein a cross-sectional area of a surface of each insulating protrusion close to the base substrate is less than that of a surface of the insulating protrusion away from the base substrate.

18. A light emitting transistor, comprising:
a gate electrode on a base substrate;
an insulating layer on a side of the gate electrode away from the base substrate;
a first electrode on a side of the insulating layer away from the base substrate, wherein the first electrode is provided with a plurality of through holes therein, which are divided into a plurality of through hole groups arranged side by side in a first direction; each through hole group comprises multiple through holes arranged in a second direction, the first direction intersects the second direction;
a light emitting functional layer on a side of the first electrode away from the base substrate; and
a second electrode on a side of the light emitting functional layer away from the base substrate, wherein
the first electrode has a mesh structure comprising a plurality of metal portions arranged side by side in the first direction;
every two adjacent metal portions of the plurality of metal portions have mirror symmetry;
each metal portion comprises: a plurality of first bending portions and a plurality of second bending portions, which are alternately arranged in the second direction and bend in opposite directions; and
wherein the plurality of first bending portions and the plurality of second bending portions of every two adjacent metal portions of the plurality of metal portions define a plurality of meshes of the mesh structure.

19. A method for manufacturing the light emitting transistor of claim 18, comprising:
forming a gate electrode on a base substrate;
forming an insulating layer on a side of the gate electrode away from the base substrate;
forming a first electrode on a side of the insulating layer away from the base substrate, wherein the first electrode is provided with a plurality of through holes therein, which are divided into a plurality of through hole groups arranged side by side in a first direction; each through hole group comprises multiple through holes arranged in a second direction, the first direction intersects the second direction;
forming a light emitting functional layer on a side of the first electrode away from the base substrate; and
forming a second electrode on a side of the light emitting functional layer away from the base substrate,
wherein the forming a first electrode on a side of the insulating layer away from the base substrate comprises:
forming a plurality of first metal portions, spaced apart from each other, on the insulating layer; and
forming a plurality of second metal portions, spaced apart from each other, on the insulating layer;
wherein the plurality of first metal portions and the plurality of second metal portions form the first electrode having a mesh structure and are arranged side by side in the first direction;

each first metal portion and a second metal portion adjacent to the first metal portion have mirror symmetry;

each of the first metal portion and the second metal portion comprises: a plurality of first bending portions and a plurality of second bending portions, which are alternately arranged in the second direction and bend in opposite directions; and wherein the plurality of first bending portions and the plurality of second bending portions of each first metal portion and a second metal portion adjacent to the first metal portion define a plurality of meshes of the mesh structure.

\* \* \* \* \*